United States Patent
Shim

(10) Patent No.: US 6,966,951 B2
(45) Date of Patent: Nov. 22, 2005

(54) APPARATUS OF MANUFACTURING A SEMICONDUCTOR DEVICE

(75) Inventor: Kyung-Sik Shim, Gyeonggi-do (KR)

(73) Assignee: Jusung Engineering Co., Ltd., Kyonggi-do (KR)

( * ) Notice: Subject to any disclaimer, the term of this patent is extended or adjusted under 35 U.S.C. 154(b) by 280 days.

(21) Appl. No.: 10/228,683

(22) Filed: Aug. 27, 2002

(65) Prior Publication Data

US 2003/0037731 A1   Feb. 27, 2003

(30) Foreign Application Priority Data

Aug. 27, 2001 (KR) ................................ 2001-51669

(51) Int. Cl.⁷ ............................................. C23C 16/00
(52) U.S. Cl. ...................................... 118/726; 118/715
(58) Field of Search ................................ 118/715, 726

(56) References Cited

U.S. PATENT DOCUMENTS

| 3,785,853 | A | * | 1/1974 | Kirkman et al. | ....... | 427/255.23 |
| 5,252,132 | A | * | 10/1993 | Oda et al. | .................... | 118/725 |
| 5,527,567 | A | * | 6/1996 | Desu et al. | ................. | 427/573 |
| 5,595,606 | A | * | 1/1997 | Fujikawa et al. | ........... | 118/725 |
| 5,935,337 | A | * | 8/1999 | Takeuchi et al. | ............ | 118/724 |
| 6,070,551 | A | | 6/2000 | Li et al. | .................... | 118/723 I |
| 6,096,133 | A | * | 8/2000 | Yuuki et al. | ................ | 118/712 |
| 6,258,171 | B1 | * | 7/2001 | Agarwal | ..................... | 118/715 |
| 6,319,327 | B1 | * | 11/2001 | Tsukada et al. | ............ | 118/719 |
| 6,471,781 | B1 | * | 10/2002 | Tobe et al. | ................. | 118/726 |

FOREIGN PATENT DOCUMENTS

| JP | 63-199432 | * | 8/1988 | |
| JP | 2000-150499 | | 5/2000 | ............ H01I 21/31 |

* cited by examiner

Primary Examiner—Richard Bueker
(74) Attorney, Agent, or Firm—Duane Morris LLP

(57) ABSTRACT

An apparatus of manufacturing a semiconductor device includes a chamber having an outlet, a susceptor in the chamber to hold a substrate thereon, a source material container supplying the chamber with a source material, a liquid mass flow controller connected to the source material container, a plurality of vaporizers connected to the liquid mass flow controller, a plurality of source gas injectors, each of which is connected to each vaporizer and one end of each of which projects into the chamber, a reactive gas container supplying the chamber with a reactive gas, and a plurality of reactive gas injectors connected to the reactive gas container, one end of each of which projects into the chamber.

17 Claims, 2 Drawing Sheets

APPARATUS OF MANUFACTURING A SEMICONDUCTOR DEVICE

This application claims the benefit of Korean Patent Application No. 2001-51669, filed on Aug. 27, 2001 in Korea, which is hereby incorporated by reference for all purposes as if fully set forth herein.

BACKGROUND OF THE INVENTION

1. Field of the Invention

The present invention relates to an apparatus of manufacturing a semiconductor device and more particularly, to an apparatus of depositing a thin film.

2. Discussion of the Related Art

Due to a method of depositing a thin film such as a chemical vapor deposition (CVD) method with a development of a new material, semiconductor devices such as a large-scale integrated circuit (LSI) or an ultra large-scale integrated circuit (ULSI) are made possible.

The semiconductor devices are generally fabricated by repeating processes of depositing and patterning. These processes are accomplished in a manufacturing apparatus of the semiconductor device under vacuum condition.

The manufacturing apparatus of the semiconductor device is variously classified according to a purpose. In general, the apparatus includes a processing chamber, a controller which controls surroundings within the chamber, and a gas supplying system which stores source materials and provides the source materials.

Recently, for the sake of manufacturing a large capacitive Dynamic Random Access Memory (DRAM) over 1 Gb (gigabit), $ABO_3$ type doubleoxide having a relative dielectric constant of over 100, i.e. perovskite type doubleoxide such as barium-strontium-titanate (BST: $(Ba, Sr)TiO_3$), or tantalum oxide ($Ta_2O_5$) is used as a dielectric material of a capacitor. Besides, ruthenium (Ru) has been developed as an electrode material of the capacitor.

The above materials are deposited in the form of a thin film by using an apparatus such as a CVD system, which is the apparatus for processing a single substrate and may be a vertical furnace type.

FIG. 1 shows a related art apparatus of manufacturing a semiconductor device, particularly depositing a thin film. In FIG. 1, the related art apparatus includes a chamber 10, a source supplying system 20 for providing a source material, and a reactive gas supplying system 30 for providing a reactive gas.

The chamber 10 that is an airtight reaction container has an outlet 14 at one side, and the upper part of the chamber 10 is dome-shaped. The air in the chamber 10 is exhausted out of the chamber 10 through the outlet 14. A susceptor 12 is also situated within the chamber 10 and a substrate 1 such as a silicon wafer or a glass substrate is posited on the susceptor 12. The susceptor 12 has a heater (not shown) for applying heat to the substrate 1 in order to improve a reaction rate. Accordingly, by heating the substrate 1, a processing speed gets fast and the gained results become stable.

The source supplying system 20 includes a source material container 22, a liquid mass flow controller (LMFC) 24, a vaporizer 26, and a source gas injector 28. The source material container 22 has a store of a source material in liquid phase. The LMFC 24 controls the flow rate of the source material, and the vaporizer 26 changes the source material going through the LMFC 24 from liquid phase into gas phase. The source gas injector 28 injects a gas phase source material, i.e. a source gas, into the chamber 10 and one end of the source gas injector 28 projects into the chamber 10 passing through the bottom of the chamber 10.

Meanwhile, the reactive gas supplying system 30 is composed of a reactive gas container (not shown), which is situated outside of the chamber 10, and a reactive gas injector 34. The reactive gas within the reactive gas container is injected into the chamber 10 through the reactive gas injector 34.

In the related art apparatus of FIG. 1, first the substrate 1 is loaded on the susceptor 12, and the air within the chamber 10 is exhausted through the outlet 14 by a pumping system (not shown). Therefore, the inside of the chamber 10 forms a vacuum. Next, the source material within the source material container 22 is supplied to the vaporizer 26 after controlling the flow rate via the LMFC 24. The source material, which is liquid phase yet, changes into gas phase in the vaporizer 26, and the gas phase source material, i.e. a source gas, is injected into the chamber 10 through the source gas injector 28. On the other hand, the reactive gas within the reactive gas container (not shown) is simultaneously injected into the chamber 10 through the reactive gas injector 34. At this time, the injected source gas and the injected reactive gas come to diffuse in the inside of the chamber 10 because the inside pressure of the chamber 10 is lower than those of the source gas injector 28 and the reactive gas injector 34. Then, the injected source gas and the injected reactive gas react with each other, and products are created. The products are deposited on the substrate 1, thereby a thin film is formed on the substrate 1. Here, the substrate 1 is heated during the above process.

At this time, radio frequency (RF) power is applied so as to improve more the reaction rate.

Since it treats a single substrate at one time, the related art apparatus of FIG. 1 is high reliable. The source gas and the reactive gas are injected by the source gas injector 28 and the reactive gas injector 34, respectively, so that it is efficient to use the inner space of the chamber 10 and it is easy to control surroundings of the process. Additionally, a superior thin film can be formed because the related art apparatus use a decomposed source gas.

By the way, in the related art apparatus, it is difficult to control the amount of the source gas because of one source gas injector 28 and one vaporizer 26. That is, as there is a limit to the amount of the source gas that the vaporizer 26 can vaporize in an hour and the vaporization rate of a normal source material is relatively low, the amount of the source gas injected into the chamber 10 is very little. If the amount of the source material is increased in order to raise the injection pressure, the vaporization rate of the source material becomes lower and finally the little amount of the source gas is injected into the chamber 10. On the other side, if the amount of the source material is decreased to lower the injection pressure, the gas phase source material is not diffused uniform. Therefore, deposition rate and uniformity of a thin film are not good.

SUMMARY OF THE INVENTION

Accordingly, the present invention is directed to an apparatus of manufacturing a semiconductor device that substantially obviates one or more of problems due to limitations and disadvantages of the related art.

An advantage of the present invention is to provide an apparatus of depositing a thin film for a semiconductor device that can increase deposition rate and uniformity of the thin film.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an apparatus of manufacturing a semiconductor device includes a chamber having an outlet, a susceptor in the chamber to hold a substrate thereon, a source material container supplying the chamber with a source material, a liquid mass flow controller connected to the source material container, a plurality of vaporizers connected to the liquid mass flow controller, a plurality of source gas injectors, each of which is connected to each vaporizer and one end of each of which projects into the chamber, a reactive gas container supplying the chamber with a reactive gas, and a plurality of reactive gas injectors connected to the reactive gas container, one end of each of which projects into the chamber.

In another aspect, an apparatus of manufacturing a semiconductor device includes a chamber having an outlet, a susceptor in the chamber to hold a substrate thereon, a source material container supplying the chamber with a source material, a plurality of liquid mass flow controllers connected to the source material container, a plurality of vaporizers, each of which is connected to each liquid mass flow controller, a plurality of source gas injectors, each of which is connected to each vaporizer and one end of each of which projects into the chamber, a reactive gas container supplying the chamber with a reactive gas, and a plurality of reactive gas injectors connected to the reactive gas container, one end of each of which projects into the chamber.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, which are illustrated in the accompanying drawings.

Figure 1:
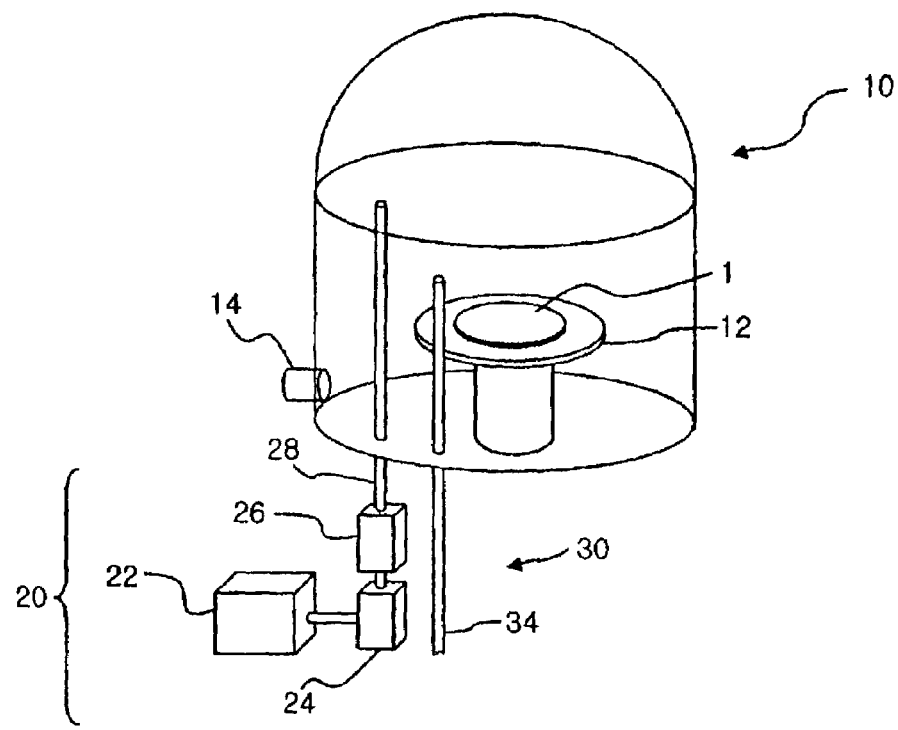
FIG. 1 is a schematic view showing a related art apparatus of depositing a thin film.
Figure 2:
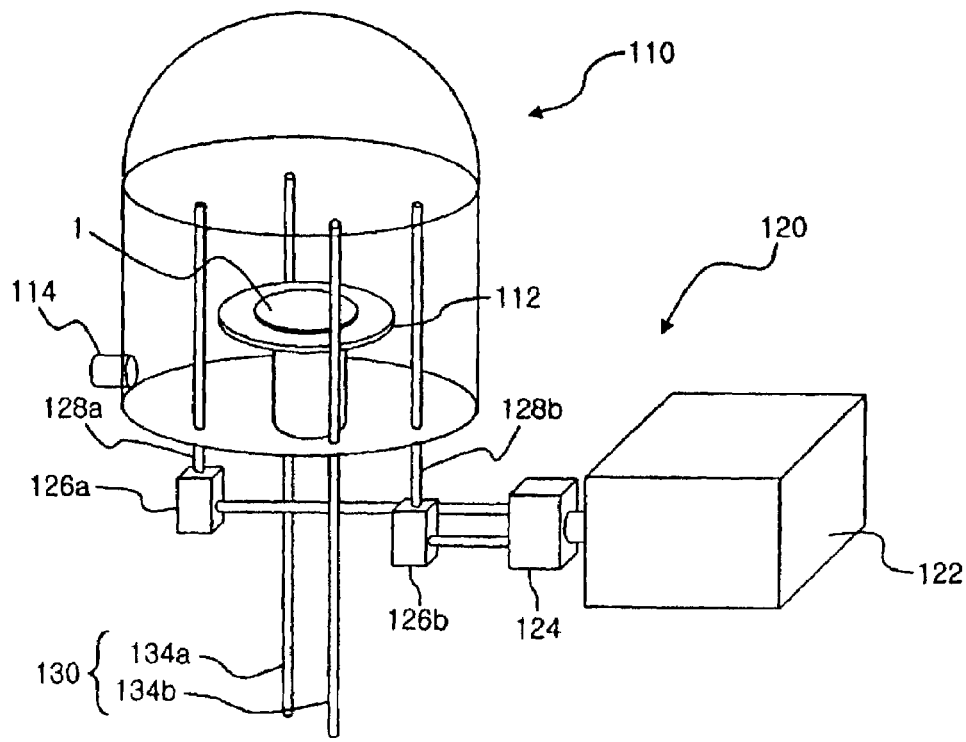
FIG. 2 is a schematic view showing an apparatus of depositing a thin film according to a first embodiment of the present invention.

FIG. 2 shows an apparatus of depositing a thin film according to a first embodiment of the present invention. As shown in FIG. 2, the apparatus includes a chamber 110, a source supplying system 120 for providing a source material, and a reactive gas supplying system 130 for providing a reactive gas.

The chamber 110 that is an airtight reaction container has an outlet 114 at one side, and the upper part of the chamber 110 is dome-shaped. The air within the chamber 110 is exhausted out of the chamber 110 through the outlet 114. A susceptor 112 is situated in the chamber 110 and a substrate 1 such as a silicon wafer or a glass substrate is posited on the susceptor 112. The susceptor 112 has a heater (not shown) for applying heat to the substrate 1 in order to improve a reaction rate. Accordingly, by heating the substrate 1, a processing speed gets fast and gained results become stable.

The source supplying system 120 includes a source material container 122, a liquid mass flow controller (LMFC) 124, two vaporizers 126a and 126b, and two source gas injectors 128a and 128b. The source material container 122 has a store of a source material in liquid phase. The LMFC 124 is connected to the source material container 122, and controls the flow rate of the source material. The vaporizers 126a and 126b change the source material going through the LMFC 124 from liquid phase into gas phase. The source gas injectors 128a and 128b are connected to the vaporizers 128a and 128b, respectively, and inject a gas phase source material, i.e. a source gas, into the chamber 110. Here, one end of each source gas injector 128a and 128b projects into the chamber 110 passing through the bottom of the chamber 110.

Meanwhile, the reactive gas supplying system 130 is composed of a reactive gas container (not shown), which is situated outside of the chamber 110, and two reactive gas injectors 134a and 134b that are connected to the reactive gas container. The reactive gas within the reactive gas container is injected into the chamber 110 through the reactive gas injectors 134a and 134b.

Figure 3:
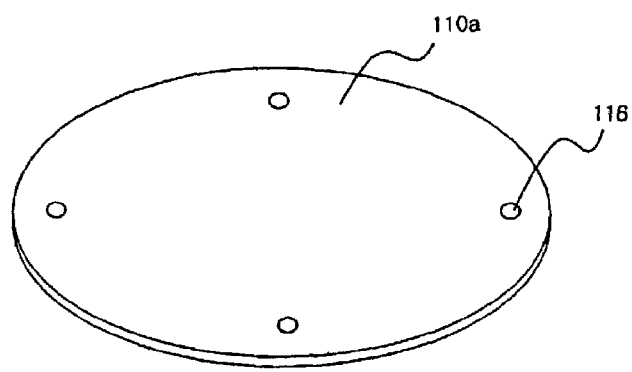
FIG. 3 is a schematic view showing a bottom of a chamber according to the present invention.

FIG. 3 is a schematic view showing a bottom of a chamber according to the present invention. As shown in the figure, the bottom of the chamber 110a has a plurality of injector holes 116, which correspond to the source gas injectors 128a and 128b and the reactive gas injectors 134a and 134b.

In the above apparatus, the number of the source gas injector and the number of the reactive gas injector can change, and thus the injector holes 116 may change. At this time, it is desirable that the number of reactive gas injectors 134a and 134b equals the number of source gas injectors 128a and 128b and the reactive gas injectors 134a and 134b alternate with the source gas injectors 128a and 128b.

In the apparatus of FIG. 2, first the substrate 1 is loaded on the susceptor 112, and the air within the chamber 110 is exhausted through the outlet 114 by a pumping system (not shown). Therefore, the inside of the chamber 110 forms a vacuum. Next, the source material within the source material container 122 is supplied to the vaporizers 126a and 126b after controlling the flow rate via the LMFC 124. The source material, which is liquid phase yet, changes into gas phase in the vaporizers 126a and 126b, and the gas phase source material, i.e. a source gas, is injected into the chamber 110 through the source gas injectors 128a and 128b, respectively. At this time, the vaporizers 126 and 126b are kept heating over 150 degrees centigrade. On the other hand, the reactive gas within the reactive gas container (not shown) is simultaneously injected into the chamber 110 through the reactive gas injectors 134a and 134b. Here, valves (not shown) may be attached the reactive gas injectors 134a and 134b to control the amount of the reactive gas.

The injected source gas and the injected reactive gas come to diffuse in the inside of the chamber 110 because the inside pressure of the chamber 110 is lower than those of the source gas injectors 128a and 128b and the reactive gas injectors 134a and 134b. Then, the injected source gas and the injected reactive gas react with each other in the chamber 110, and products are created. The products are deposited on the substrate 1, thereby a thin film is formed on the substrate 1. The thin film may be made of BST ((Ba, Sr)TiO$_3$), tantalum oxide (Ta$_2$O$_5$) or ruthenium (Ru).

The substrate 1 may be heated during the above process, and radio frequency (RF) power may be applied so as to improve more the reaction rate.

Here, the source gas injectors 128a and 128b and the reactive gas injectors 134a and 134b had better have a shape of a tube and surround the substrate 1. Besides, the injection desirably faces at the center of the substrate 1.

In the apparatus according to the first embodiment of the present invention, the source material is vaporized by two vaporizers 126a and 126b. Therefore, though the amount of the source material is increased, the source material can be vaporized sufficiently. Moreover, as the source gas is injected into the chamber 110 through the plurality of source gas injectors 128a and 128b, the injection rate increases. Accordingly, a thin film is deposited uniform and the deposition rate rises.

Figure 4:
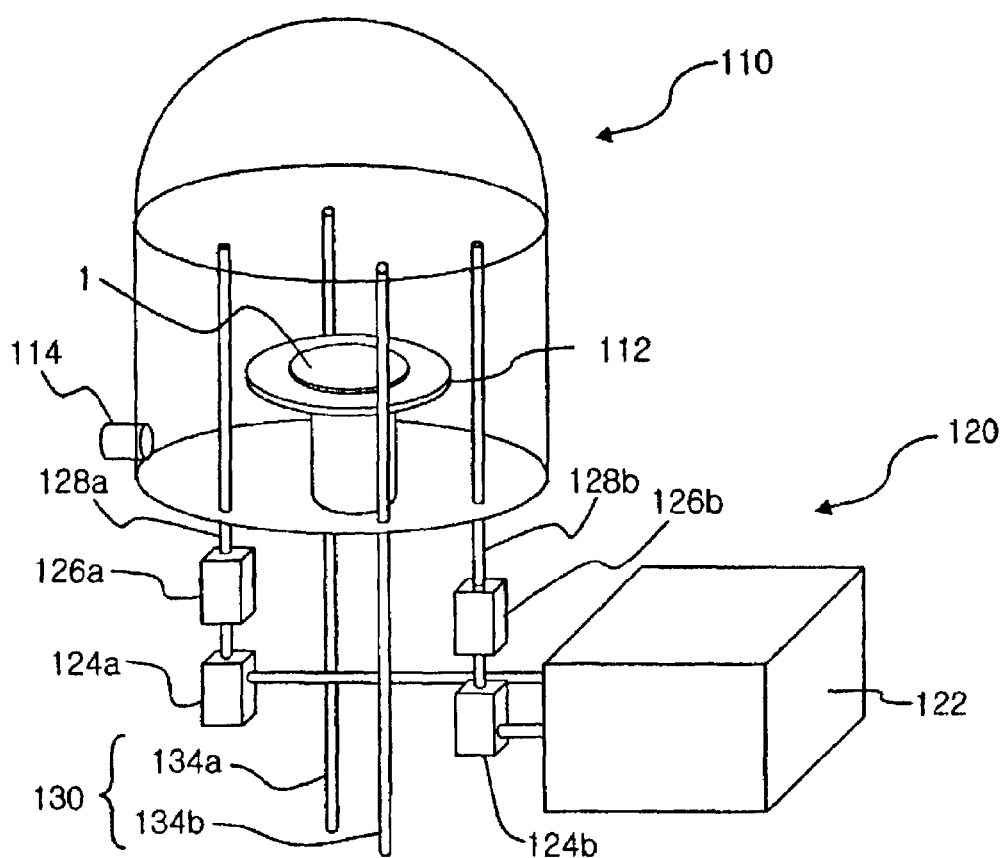
FIG. 4 is a schematic view showing an apparatus of depositing a thin film according to a second embodiment of the present invention.

FIG. 4 shows an apparatus of depositing a thin film according to a second embodiment of the present invention. The second embodiment apparatus of FIG. 4 has the same structure as the first embodiment apparatus except for the liquid mass flow controller. Therefore, the same symbol used in FIG. 2 is given to the same part as the first embodiment apparatus of FIG. 2.

In FIG. 4, the apparatus includes two liquid mass flow controllers (LMFC) 124a and 124b. The LMFCs 124a and 124b are connected to the source material container 122. The LMFCs 124a and 124b control the flow rate of a source material of liquid phase from the source material container 122, and supply two vaporizers 126a and 126b with the source material, respectively.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. An apparatus for manufacturing a semiconductor device, comprising:
    a single reaction chamber having an outlet;
    a susceptor in the single reaction chamber to hold a substrate thereon;
    a source material container for supplying the single reaction chamber with a source material;
    a liquid mass flow controller connected to the source material container;
    a plurality of vaporizers connected to the liquid mass flow controller for receiving flow from the liquid mass flow controller;
    a plurality of separate source gas injectors, each of the plurality of separate source gas injectors being connected to a respective one of the plurality of vaporizers to provide a separate source gas flow path from each vaporizer into said single reaction chamber, one end of each separate source gas injector projecting into the single reaction chamber;
    a reactive gas container for supplying the single reaction chamber with a reactive gas; and
    a plurality of reactive gas injectors connected to the reactive gas container, one end of each reactive gas injector projecting into the single reaction chamber;
    wherein the single reaction chamber is configured to receive the reactive gas from the reactive gas container and the source gas from the source material container for depositing a thin film on a semiconductor device; and wherein the plurality of vaporizers and the plurality of source gas injectors are connected to each other in such a manner that the vapor from each vaporizer is injected separately and simultaneously into the reaction chamber and mixes with vapor from the other vaporizers after entering the reaction chamber, and wherein the vapor from each vaporizer can mix with vapor from the other vaporizers only after entering the reaction chamber.

2. The apparatus according to claim 1, wherein the plurality of vaporizers are two.

3. The apparatus according to claim 2, wherein the plurality of separate source gas injectors are two.

4. The apparatus according to claim 1, wherein the number of reactive gas injectors equals the number of separate source gas injectors.

5. The apparatus according to claim 1, wherein the plurality of reactive gas injectors alternate with the plurality of separate source gas injectors.

6. The apparatus according to claim 1, wherein the plurality of separate source gas injectors have a shape of cylinder.

7. The apparatus according to claim 1, wherein a bottom of the single reaction chamber has a plurality of injector holes.

8. The apparatus according to claim 1, wherein a thin film is formed on the substrate via the apparatus, the thin film including one of barium-strontium-titanate (BST: (Ba, Sr)TiO$_3$), tantalum oxide (Ta$_2$O$_5$) and ruthenium (Ru).

9. An apparatus for manufacturing a semiconductor device, comprising:
    a single reaction chamber having an outlet;
    a susceptor in the single reaction chamber to hold a substrate thereon;
    a source material container for supplying the single reaction chamber with a source material;
    a plurality of liquid mass flow controllers connected to the source material container;
    a plurality of vaporizers, each of the plurality of vaporizers being connected to a respective one of the plurality of liquid mass flow controllers;
    a plurality of separate source gas injectors, each of the plurality of separate source gas injectors being connected to a respective one of the plurality of vaporizers to provide a separate source gas flow oath from each vaporizer into the single reaction chamber, one end of each separate source gas injector projecting into the single reaction chamber;
    a reactive gas container for supplying the single reaction chamber with a reactive gas; and
    a plurality of reactive gas injectors connected to the reactive gas container, one end of each reactive gas injector projecting into the single reaction chamber;
    wherein the plurality of vaporizers are configured to simultaneously inject source gas into the single reaction chamber; and
    wherein the single reaction chamber is configured to receive the reactive gas from the reactive gas container and the source gas from the source material container for depositing a thin film on a semiconductor device; and wherein the plurality of vaporizers and the plurality of source gas injectors are connected to each other in such a manner that the vapor from each vaporizer is injected separately and simultaneously into the reaction chamber and mixes with vapor from the other vaporizers after entering the reaction chamber, and wherein the vapor from each vaporizer can mix with vapor from the other vaporizers only after entering the reaction chamber.

10. The apparatus according to claim 9, wherein the plurality of vaporizers are two.

11. The apparatus according to claim 10, wherein the plurality of separate source gas injectors are two.

12. The apparatus according to claim 11, wherein the plurality of liquid mass flow controllers are two.

13. The apparatus according to claim 9, wherein the number of reactive gas injectors equals the number of separate source gas injectors.

14. The apparatus according to claim 9, wherein the plurality of reactive gas injectors alternate with the plurality of separate source gas injectors.

15. The apparatus according to claim 9, wherein the plurality of separate source gas injectors have a shape of cylinder.

16. The apparatus according to claim 9, wherein a bottom of the reaction chamber has a plurality of injector holes.

17. The apparatus according to claim 9, wherein a thin film is formed on the substrate via the apparatus, the thin film including one of barium-strontium-titanate (BST: (Ba, Sr)TiO$_3$), tantalum oxide (Ta$_2$O$_5$) and ruthenium (Ru).

* * * * *